United States Patent
Regev

(10) Patent No.: US 6,816,424 B2
(45) Date of Patent: Nov. 9, 2004

(54) WRITING TO AND READING FROM A RAM OR A CAM USING CURRENT DRIVERS AND CURRENT SENSING LOGIC

(75) Inventor: Zvi Regev, West Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/714,486

(22) Filed: Nov. 17, 2003

(65) Prior Publication Data

US 2004/0136254 A1 Jul. 15, 2004

Related U.S. Application Data

(63) Continuation of application No. 10/188,144, filed on Jul. 3, 2002, now Pat. No. 6,678,196.
(60) Provisional application No. 60/303,247, filed on Jul. 6, 2001.

(51) Int. Cl.[7] .................................................. G11C 7/00
(52) U.S. Cl. ................................... 365/205; 365/189.05
(58) Field of Search ............................... 365/195, 205, 365/189.04, 189.09, 189.05, 196, 189.005

(56) References Cited

U.S. PATENT DOCUMENTS

| | | | |
|---|---|---|---|
| 4,791,606 A | | 12/1988 | Threewitt et al. |
| 5,528,545 A | * | 6/1996 | Takahashi et al. .......... 365/208 |
| 5,920,886 A | | 7/1999 | Feidmeier |
| 6,108,227 A | | 8/2000 | Voelkel |

* cited by examiner

*Primary Examiner*—Thong Q. Le
(74) *Attorney, Agent, or Firm*—Dickstein Shapiro Morin & Oshinsky LLP

(57) ABSTRACT

A static memory device that utilizes differential current bit line drivers to write information into the device's memory cells, and differential current sensing read amplifiers to read information from the cells. The drivers and amplifiers operate using limited differential current. The use of limited differential current, as opposed to voltages, reduces the power consumed by the device and increases the speed of read and write operations.

21 Claims, 10 Drawing Sheets

WRITING TO AND READING FROM A RAM OR A CAM USING CURRENT DRIVERS AND CURRENT SENSING LOGIC

This application claims priority from provisional application Ser. No. 60/303,247, filed Jul. 6, 2001, which is hereby incorporated by reference in its entirety, and is a continuation of application Ser. No. 10/188,144, filed on Jul. 3, 2002, now U.S. Pat. No. 6,678,196 which is hereby incorporated by reference in its entirety.

FIELD OF THE INVENTION

The present invention relates generally to memory circuits and, more particularly to a method of and apparatus for writing to and reading from a memory device using current drivers and current sensing logic.

BACKGROUND OF THE INVENTION

An essential semiconductor device is semiconductor memory, such as a random access memory (RAM) device. A RAM allows a memory circuit to execute both read and write operations on its memory cells. A typical example of a RAM device is a static random access memory (SRAM).

A standard SRAM cell 10 is shown in FIG. 1. The cell 10 consists of four transistors 14, 16, 18, 20 that form a bistable flip-flop and two control or access transistors 12, 22. The access transistors 12, 22 have their gate terminals connected to a word select line WS (also known as a word line). The first access transistor 12 is coupled between a first bit line DBIT and a first node A. The second access transistor 22 is coupled between a second bit line DBIT_N (typically the complement of the first bit line DBIT) and a second node B.

Data is written or stored into the cell 10 with either a high potential at node A and a low potential at node B, or a low potential at node A and a high potential at node B. This means that two stable states are available, which are defined as either a logic "1" or a logic "0". The configuration of the four transistors 14, 16, 18, 20 (i.e., flip-flop) is such that the potentials at the two nodes A, B are retained as long as power is supplied to the cell 10. Thus, unlike other RAM devices (e.g., DRAM), the SRAM cell 10 does not need to be periodically refreshed to retain its contents.

The logic state of the SRAM cell 10 is read by sensing the differential voltage developed on the bit line pair comprised of the two bit lines DBIT, DBIT_N. When the word line WS is selected, the access transistors 12, 22 are turned on, which allows access to the cell's 10 contents via the bit lines DBIT, DBIT_N. In most applications, the SRAM cell 10 is embedded in an array of similar cells. The typical array is organized into a plurality of rows and columns, with rows corresponding to word lines (e.g., WS) and columns corresponding to the bit lines (e.g., DBIT, DBIT_N). To read data stored in the SRAM array, row and column addresses are used to access the desired memory cell (via the WS, DBIT and DBIT_N). That is, a particular address within the SRAM array is accessed.

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data being stored within a given memory location) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., SRAM). As set forth above, in an SRAM device, during a memory access, the user supplies an address and reads into or gets back the data at the specified address. In a CAM, however, data is stored in locations in a somewhat random fashion. The locations can be selected by an address bus, or the data can be written into the first empty memory location. Every location has a pair of status bits that keep track of whether the location is storing valid information in it or is empty and available for writing.

Once information is stored in a memory location, it is found by comparing every bit in memory with data placed in a match detection circuit. When the content stored in the CAM memory location does not match the data placed in the match detection circuit, the CAM device returns a no match indication. When the content stored in the CAM memory location matches the data placed in the match detection circuit, the CAM device returns a match indication. In addition, the CAM may return the identification of the address location in which the desired data is stored. Thus, with a CAM, the user supplies the data and gets back the address if there is a match found in memory.

FIG. 2 illustrates a typical CAM cell 30, which for the most part comprises an SRAM cell 10. The CAM cell 30 is a static memory device and is sometimes referred to as a static CAM cell. Additional transistors 32, 34, 36, 38 are used to report the result of the matching function performed by the CAM 30. The matching function is performed by an exclusive-NOR operation, so that a match is only indicated if both the stored bit and a corresponding comparand bit (i.e., bit to be searched for) have the same state. The four additional transistors 32, 34, 36, 38 are used to perform the exclusive NOR ("XNOR") and match line MLINE driving operations (discussed below) and will be referred to herein as the XNOR transistors 32, 34, 36, 38.

The first XNOR transistor 32 has its gate coupled to the complementary match bit line (MBIT_N) and is coupled between the second XNOR transistor 34 and a ground potential. The second XNOR transistor 34 has its gate coupled to the first node A and is coupled between the first XNOR transistor 32 and a match line MLINE. The fourth XNOR transistor 38 has its gate coupled to the match bit line (MBIT) and is coupled between the third XNOR transistor 36 and a ground potential. The third XNOR transistor 36 has its gate coupled to the second node B and is coupled between the fourth XNOR transistor 38 and the match line MLINE. The match bit line MBIT will contain the value of the comparand while the complementary match bit line MBIT_N will contain the complementary value of the comparand.

For writing and reading, the CAM cell 30 is operated as an SRAM cell. That is, the differential bit lines DBIT, DBIT_N are used to latch data into the cell 30 when writing, while the differential on these bit lines are sensed (via sense amplifiers) during reading. For comparing, the match line MLINE is typically precharged to a high potential (e.g., VDD). The XNOR transistors 32, 34, 36, 38 compare the internally stored state of the cell 30 to the state of the comparand (via match bit lines MBIT, MBIT_N). If the states do not match, the match line MLINE is pulled down to the ground potential via the XNOR transistors 32, 34, 36, 38 to indicate the mismatch. The match line MLINE is fed to an encoder that determines whether any matches exists, whether more than one match exists, and which location is considered the highest priority.

In SRAM and CAM devices, the bit lines DBIT, DBIT_N traverse the whole depth of the devices. Being long lines, heavily loaded with capacitance, read and write operations utilizing the bit lines DBIT, DBIT_N take a significant amount of time to complete and consume a large percentage of the power dissipated in the memory device. It is desirable to increase the speed of read and write operations and reduce the amount of power consumed during the read and write operations performed in SRAM and CAM devices.

SUMMARY OF THE INVENTION

The present invention provides a static memory device having reduced power consumption during read and write operations.

The present invention provides a static memory device having increased read and write operation speeds.

The above and other features and advantages are achieved by a static memory device that utilizes differential current bit line drivers to write information into the device's memory cells, and differential current sensing read amplifiers to read information from the cells. The drivers and amplifiers operate using limited differential current. The use of limited differential current, as opposed to voltages, reduces the power consumed by the device and increases the speed of read and write operations.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

Figure 3:
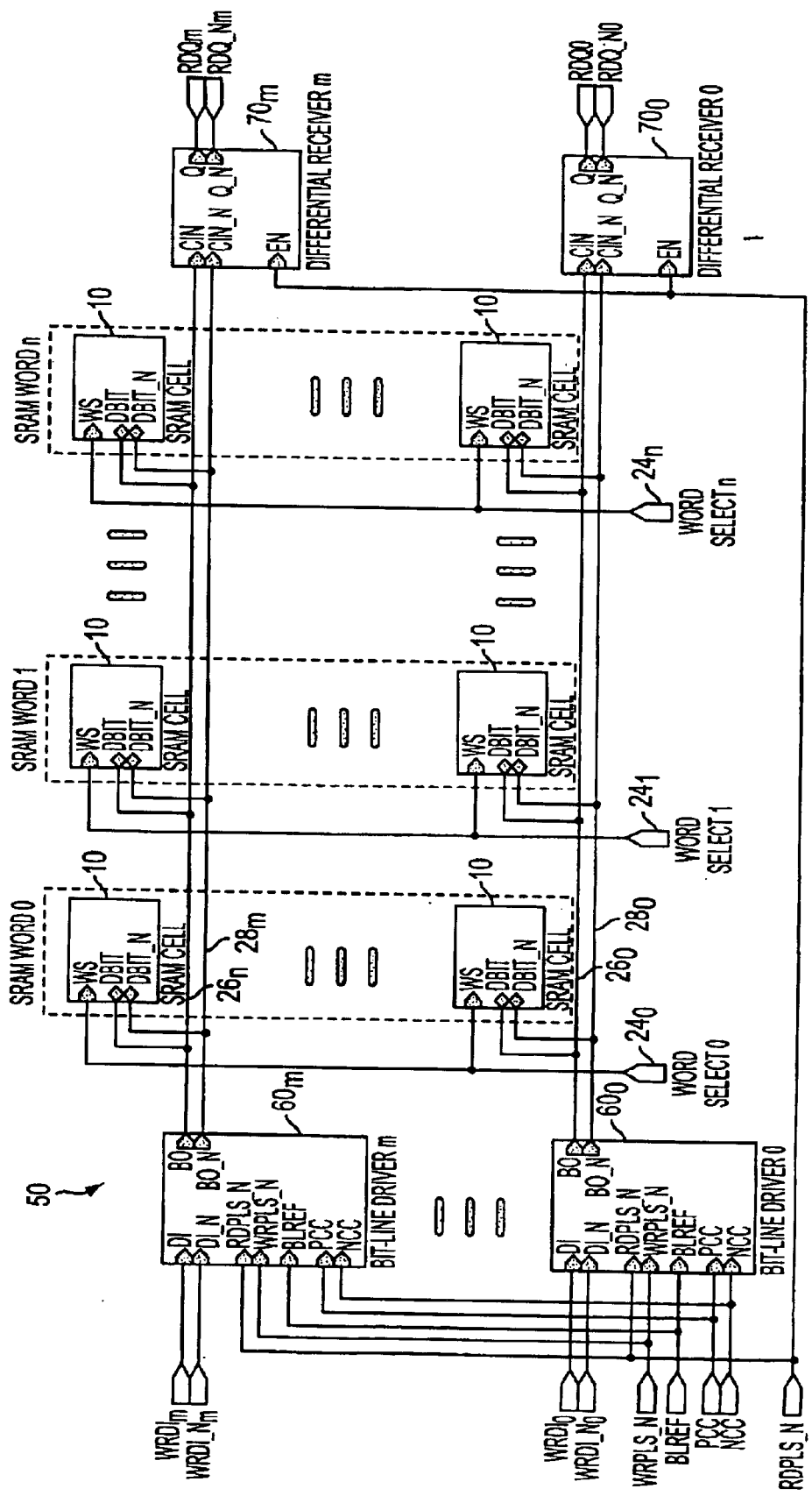
FIG. 3 is a circuit diagram illustrating an SRAM memory device.

FIG. 3 is a circuit diagram illustrating an SRAM memory device 50. The device 50 includes a plurality of bit line drivers $60_0$ to $60_m$, SRAM cells 10 and differential receivers $70_0$ to $70_m$. The SRAM cells 10 are organized as an array of words WORD 0, WORD 1 to WORD n, each word comprising m bits.

The first driver $60_0$ is connected to receive bit 0 of write data 0 $WRDI_0$, and its complement $WRDI\_N_0$, a write pulse WRPLS_N, bit line reference BLREF, two control signals PCC, NCC and a read pulse RDPLS_N. It should be noted that $WRDI_0$ and $WRDI\_N_0$ do not have to be complements. In certain circumstances, such as when a write operation is completed, it is desirable to have both $WRDI_0$ and $WRDI\_N_0$ set to a low level. Typically, it is not desirable to have both $WRDI_0$ and $WRDI\_N_0$ set to a high level. Thus, the combination of the $WRDI_0$ and $WRDI\_N_0$ can have three states.

The first driver $60_0$ uses the input write data $WRDI_0$, and its complement $WRDI\_N_0$, to drive a first bit line $26_0$ and a second bit line $28_0$. The bit lines $26_0$, $28_0$ are connected to an SRAM cell 10 in each array of words WORD 0, WORD 1 to WORD n. The other drivers $60_m$ receive other bits of the write data (e.g., $WRDI_m$ and $WRDI\_N_m$) and use the data to drive other first and second bit lines (e.g., $26_m$ and a $28_m$). The other bit lines $26_m$, $28_m$ are connected to respective SRAM cells 10 in each array of words WORD 0, WORD 1 to WORD n. Word select lines WORD SELECT 0, WORD SELECT 1 to WORD SELECT n are respectively connected to each array of words WORD 0, WORD 1 to WORD n so that one of the words may be selected.

The first differential receiver $70_0$ is connected to respective first and second bit lines $26_0$, $28_0$ and the read pulse RDPLS_N. In FIG. 3, the illustrated receiver $70_0$ is connected to the bit lines $26_0$, $28_0$ corresponding to bit 0 (and its complement) of all of the array of words WORD 0, WORD 1 to WORD n. In operation, the receiver $70_0$ senses the information on the bit lines $26_0$, $28_0$ and outputs read data $RDQ_0$ and its complement $RDQ\_N_0$.

Likewise, the other receivers (e.g., $70_m$) are connected to respective first and second bit lines (e.g., $26_m$, $28_m$) and the read pulse RDPLS_N. The other receivers (e.g., $70_m$) are connected to respective first and second bit lines (e.g., $26_m$, $28_m$) that correspond to respective bits (and their complements) of all of the array of words WORD 0, WORD 1 to WORD n. The other receivers (e.g., $70_m$) in the device 50 operate in the same manner as the first receiver $70_0$. The write pulse WRPLS_N, bit line reference BLREF, control signals PCC, NCC and read pulse RDPLS_N are described below in more detail with reference to FIGS. 5 to 10.

Figure 1:
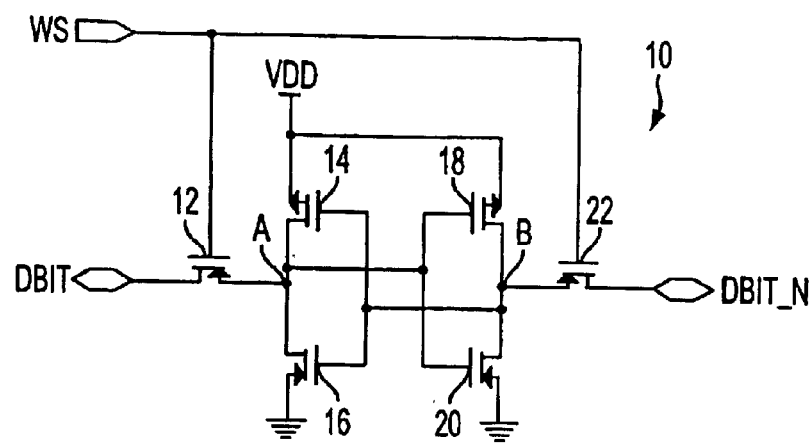
FIG. 1 is a circuit diagram illustrating a typical SRAM cell.
Figure 2:
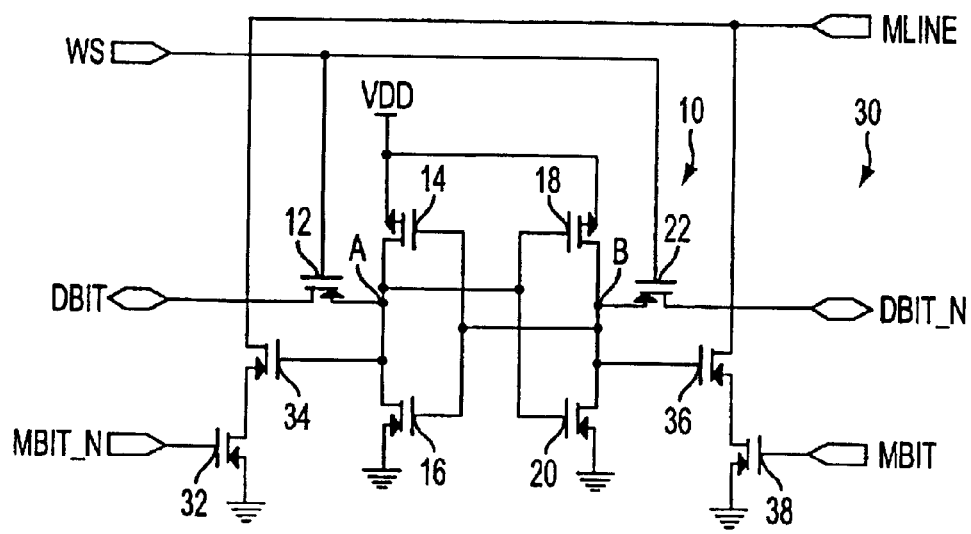
FIG. 2 is a circuit diagram illustrating a typical CAM cell.
Figure 4:
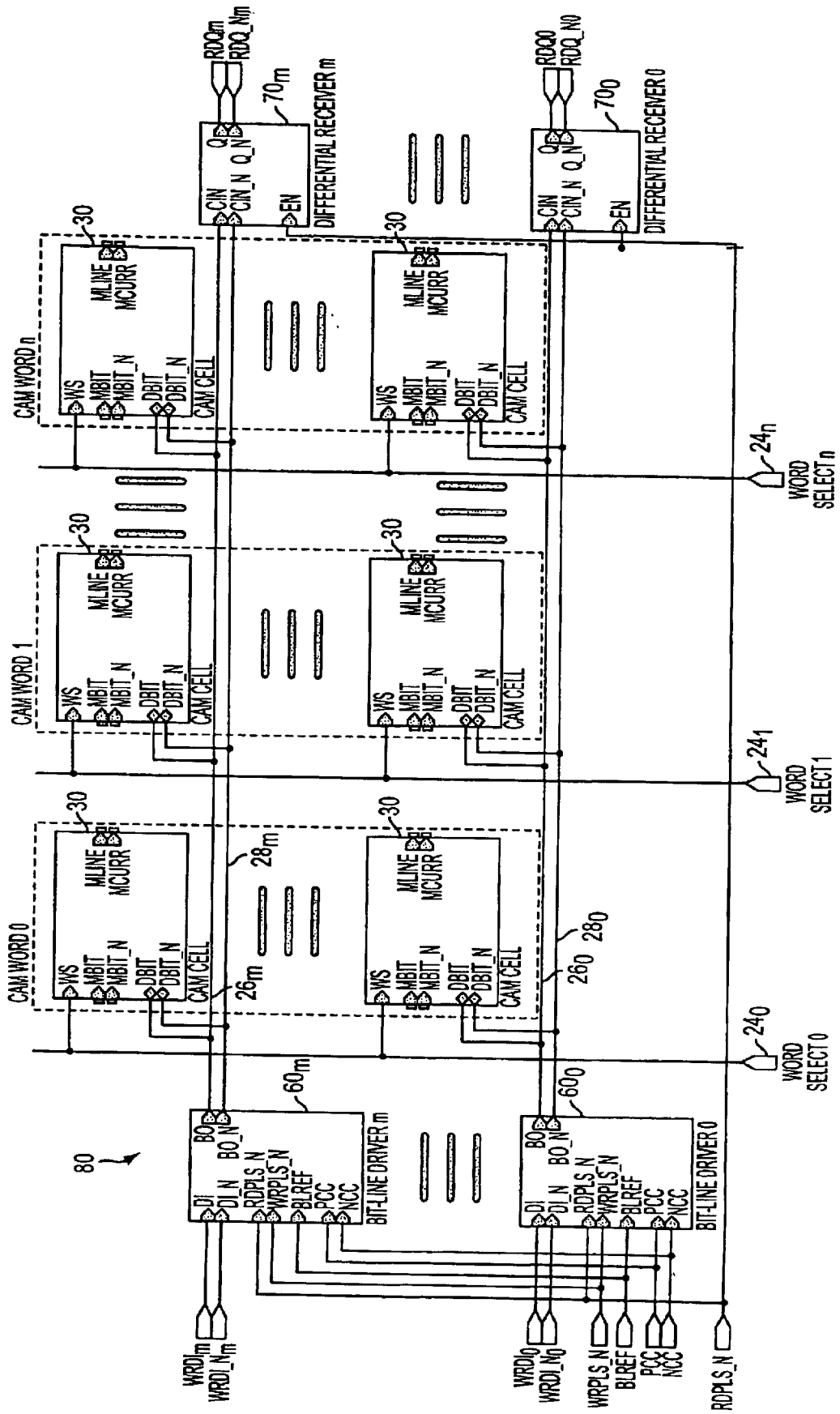
FIG. 4 is a circuit diagram illustrating a CAM memory device.

FIG. 4 is a circuit diagram illustrating a CAM memory device 80. The device 80 is essentially the same as the SRAM device 50 illustrated in FIG. 3. Thus, the device 80 includes a plurality of bit line drivers $60_0$ to $60_m$ and differential receivers $70_0$ to $70_m$. The device 80 uses CAM cells 30 in its arrays rather than SRAM Cells. Otherwise, the configuration of the CAM device 80 is the same as the SRAM device 50. As explained above with reference to FIG. 2, the CAM cells 30 include inputs for match bit lines (MBIT, MBIT_N) and output connectable to a match line (MLINE). These additional inputs and output, however, are irrelevant for the purposes of the present invention.

Referring to FIGS. 3 and 4, in the SRAM and CAM devices 50, 80, information is read from the respective memory cells 10, 30 via the bit lines $26_0$, $28_0$ to $26_m$, $28_m$. Similarly, information is written in to the respective memory cells 10, 30 of the SRAM and CAM devices 50, 80 via the bit lines $26_0$, $28_0$ to $26_m$, $28_m$. Traditionally, to write information in to the devices 50, 80, the bit lines $26_0$, $28_0$ to $26_m$, $28_m$ are asserted to the data level and its inverse (e.g., complement). A word enable line is set high and used to start the write operation. When the write operation is complete, the bit lines $26_0$, $28_0$ to $26_m$, $28_m$ are set high and the word enable is set low.

Prior to reading the contents of the respective memory cells 10, 30 of the SRAM and CAM devices 50, 80, the bit lines $26_0$, $28_0$ to $26_m$, $28_m$ are precharged to a high state. The precharging of the bit lines $26_0$, $28_0$ to $26_m$, $28_m$ prevents the alteration of the cells' 10, 30 contents while the cells 10, 30 are being read. The word enable is set high and the bit line drivers and the bit line drivers $60_0$ to $60_m$ are tri-stated to allow the selected SRAM or CAM cell(s) 10, 30 to discharge one of the bit lines $26_0$, $28_0$ to $26_m$, $28_m$ to a low level.

The bit lines $26_0$, $28_0$ to $26_m$, $28_m$ are long and connected to numerous devices. The bit lines $26_0$, $28_0$ to $26_m$, $28_m$ are usually segmented to allow small drivers $60_0$ to $60_m$ to drive them. When all of the segments are combined, however, the bit lines $26_0$, $28_0$ to $26_m$, $28_m$ traverse the whole depth of the device 50, 80 and are heavily loaded with parasitic capacitance. Being long lines, heavily loaded with capacitance, read and write operations utilizing the bit lines $26_0$, $28_0$ to $26_m$, $28_m$ take a significant amount of time to complete and consume a large percentage of the power dissipated in the memory device.

Using current instead of voltage in the write and read processes allows these operations to be executed in a shorter period of time. They will also use less power. When read and write operations are not being performed, the bit lines $26_0$, $28_0$ to $26_m$, $28_m$ are usually held at a high level to prevent accidental corruption of the data stored in the cells 10, 30. It has been discovered that keeping both bit lines of a bit line pair (e.g., bit lines $26_0$, $28_0$) at the same potential, lower than the high potential level, but higher than VDD/2, will prevent the cells 10, 30 from changing their state. Having both bit lines of the bit line pair (e.g. bit lines $26_0$, $28_0$) "idle" at a potential slightly higher than VDD/2 enables read and write operations to be performed faster and with lower power consumption.

For the write operation, if both bit lines of the bit line pair (e.g. bit lines $26_0$, $28_0$) idle at about VDD/2, only a small differential voltage change on the bit lines is required to cause the cells 10, 30 to change state (when desired). This differential voltage may be in the order of 200 millivolts. As will be discussed below with respect to FIGS. 5 to 10, using opposing currents on the bit lines to charge and discharge the parasitic capacitance on the lines allows the rate and magnitude of the differential voltage change on the bit lines to be tightly controlled. Moreover, restricting the differential voltage change to a safe level above the required minimum, but not much more, reduces the time required to execute the write operation and lowers the power consumption in the process.

Figure 5:
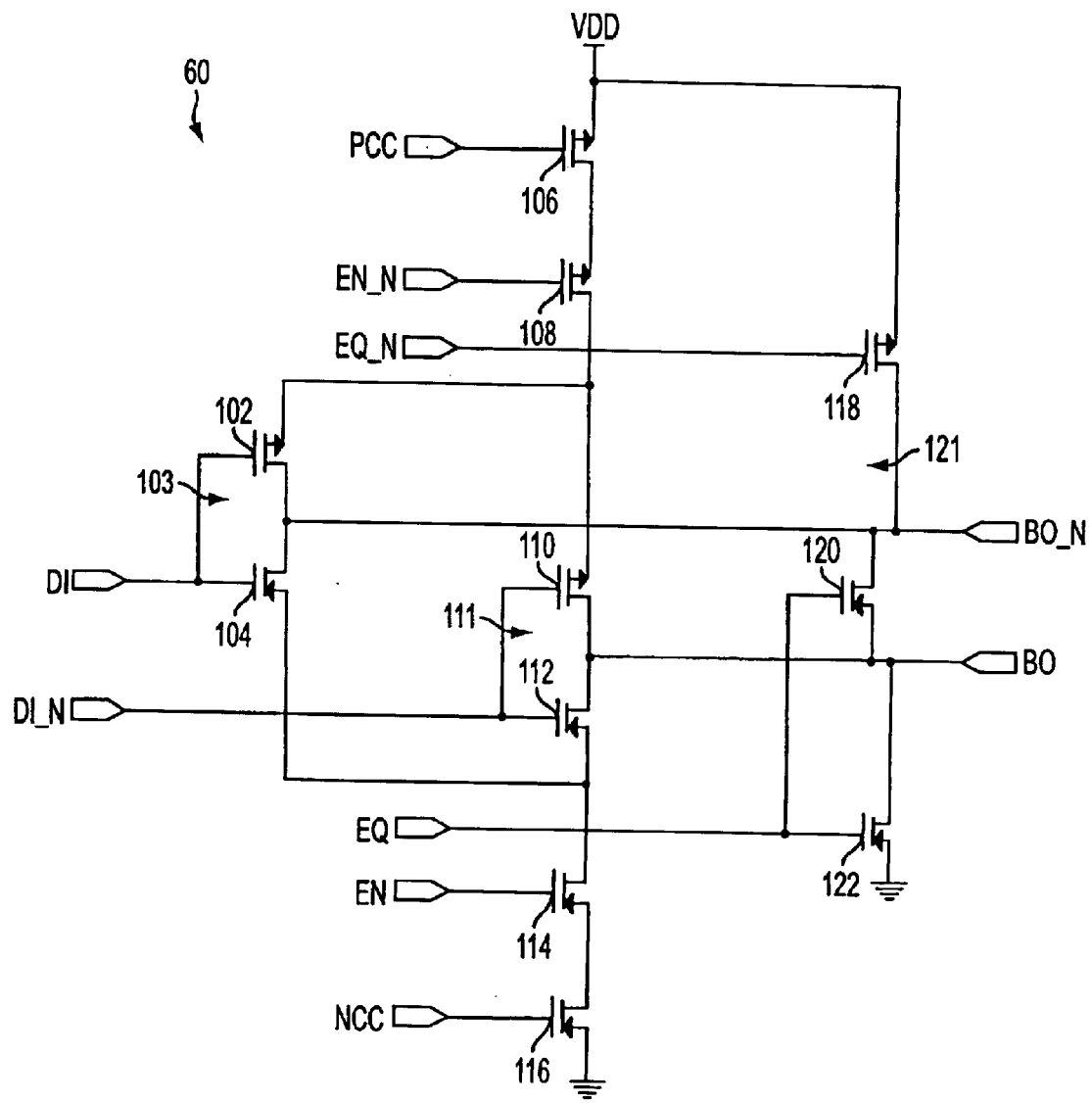
FIG. 5 is a circuit diagram illustrating a differential bit line driver constructed in accordance with an embodiment of the invention.

FIG. 5 is a circuit diagram illustrating a differential bit line driver 60 constructed in accordance with an embodiment of the invention. The driver 60 includes a first p-type transistor 102 and a first n-type transistor 104 configured as a first CMOS driver 103 and a second p-type transistor 110 and n-type transistor 112 configured as a second CMOS driver 111. The first CMOS driver 103 is connected to a first data input DI while the second CMOS driver 111 is connected a second data input DI_N. Since the driver 60 is a write driver, the data inputs DI, DI_N represent a write data bit. The second CMOS driver 111 drives a first bit line output BO while the first CMOS driver 103 drives a second bit line output BO_N. The bit line outputs BO, BO_N are connected to the bit lines (e.g., $26_0$, $28_0$) that are connected to memory cells 10, 30 as illustrated in FIGS. 3 and 4.

The two data inputs DI and DI_N are typically complements of each other when write data is being input, but in certain circumstances, such as when a write operation is completed, it is desirable to have both DI and DI_N set to a low level. Typically, it is not desirable to have both DI and DI_N set to a high level. Similarly, the two bit line outputs BO and BO_N are typically complements of each other when data is being driven onto the bit lines, but in certain circumstances, such as when a write operation is completed, it is desirable to have both BO and BO_N set to the same level, slightly higher than VDD/2.

The driver 60 includes a three more p-type transistors 106, 108, 118 and four more n-type transistors 114, 116, 120, 122. The third p-type transistor 106 is connected between a first voltage (e.g., VDD) and the fourth p-type transistor 108 and has its gate connected to a first control signal PCC. The first control signal PCC is used to control the resistance of the third p-type transistor 106, making the transistor 106 essentially a variable resistor. The fourth p-type transistor 108 is connected between the third p-type transistor 106 and the second p-type transistor 110 (part of the second CMOS driver 111). The fourth p-type transistor 108 is also connected to the first p-type transistor 102 and has its gate connected to a complementary enable signal EN_N. The fourth p-type transistor 108 serves a switch activated by a complementary enable signal EN_N having a low voltage level.

The fourth n-type transistor 116 is connected between a second voltage (e.g., ground) and the third n-type transistor 114 and has its gate connected to a second control signal NCC. The second control signal NCC is used to control the resistance of the fourth n-type transistor 116, making the transistor 116 essentially a variable resistor. The third n-type transistor 114 is connected between the fourth n-type transistor 116 and the second n-type transistor 112 (part of the second CMOS driver 111). The third n-type transistor 114 is also connected to the first n-type transistor 104 and has its gate connected to an enable signal EN. The third n-type transistor 114 serves as an on/off switch activated by an enable signal EN with a high voltage level.

The fifth p-type transistor 118 and the fifth and sixth n-type transistors 120, 122 form a biasing circuit 121 controllable by the equilibration EQ and complementary equilibration EQ_N signals. The fifth p-type transistor 118 is connected between the first voltage and the second bit line output BO_N. The fifth p-type transistor 118 has a relatively large resistance that is switched into the driver 60 when the complementary equilibration signal EQ_N is at a low voltage level. The sixth n-type transistor 122 is connected between the second voltage and the first bit line output BO. The sixth n-type transistor 122 has a relatively large resistance that is switched into the driver 60 when the equilibration signal EQ is at a high voltage level. The fifth n-type transistor 120 is connected between the first and second bit line outputs BO, BO_N. The fifth n-type transistor 120 has a relatively small resistance that is switched into the driver 60 when the equilibration signal EQ is at a high voltage level.

In operation, the two CMOS drivers 103, 111 will drive the current based on inputs received from the two data inputs DI, DI_N. The flow of current is controlled by the third and fourth p-type transistors 106, 108 and the third and fourth n-type transistors 114, 116. As is explained below, the fourth p-type transistor 108 and the third n-type transistor 114 are switches that allow current to pass through them when activated. The third p-type transistor 106 and the fourth n-type transistor 116 are variable resistors that control the amount of current flowing in the positive and negative directions.

For example, when the enable signal EN is high, the complementary enable signal EN_N is low, the fourth n-type transistor 114 and the fourth p-type transistor 108 are switched on. Current can flow through the third p-type and fourth n-type transistors 106, 116. The amount of current depends on the resistance of the third p-type and fourth n-type transistors 106, 116, which is controlled by the PCC and NCC signals, respectively. By contrast, if the enable signal EN is low, the complementary enable signal EN_N is high, the third n-type transistor 114 and the fourth p-type transistor 108 are switched off, which prohibits current flowing through the third and fourth p-type transistors 106, 108 and the third and fourth n-type transistors 114, 116.

When the enable signal EN and the first data input DI are high and the second data input DI_N is low, current will flow through the third and fourth p-type transistors 106, 108, and then through the second p-type transistor 110 to the first bit line output BO. There will also be current flowing in the opposite direction from the second bit line output BO_N through the first n-type transistor 104, and then through the third and fourth n-type transistors 114, 116 to the second voltage (e.g., ground).

When the enable signal EN and the second data input DI_N are high, and the first data input DI is low, current will flow through the third and fourth p-type transistors 106, 108, and then through the first p-type transistor 102 to the second bit line output BO_N. There will also be current flowing in the opposite direction from the first bit line output BO through the second n-type transistor 112, and then through the third and fourth n-type transistors 114, 116 to the second voltage (e.g., ground).

The enable signal EN and its complement EN_N are used to enable the writing process. In contrast, the equilibration signal EQ, and its complement EQ_N are used both for writing and reading operations. Whenever a write OR a read operation is commanded, the equilibration signal EQ, is set low, and it complement EQ_N is set high. Whenever the write or read operation is completed, the equilibration signal EQ is turned high, and its complement EQ_N is turned low. Under no condition are both the enable signal EN, and the equilibration signal EQ, simultaneously high.

The current flow described above is conditioned upon the biasing circuit 121 as follows. If the equilibration signal EQ is high, the complementary equilibration signal EQ_N is low, the fifth p-type and fifth and sixth n-type transistors 118, 120, 122 will be activated (i.e., "on"), switching in the large resistances of the fifth p-type and sixth n-type transistors 118, 122 and the smaller resistance of the fifth n-type transistor 120. As described above, if the enable signal EN is low, current does not flow through the third and fourth p-type transistors 106, 108 and the third and fourth n-type transistors 114, 116. The bit line outputs BO, BO_N will be shorted together through the small resistance of the activated fifth n-type transistor 120, while at the same time, the larger resistance of the activated fifth p-type transistor 118 pulls the first bit line output BO to the first voltage and the larger resistance of the activated sixth n-type transistor 122 pulls the second bit line output BO_N to the second voltage. Thus, the two bit line outputs BO, BO_N are biased to a predetermined voltage somewhere between VDD and VDD/2. It is desirable to have the predetermined voltage set to approximately 55% of VDD (i.e., 0.55*VDD).

Thus, when the driver 60 is not being enabled for a write operation, the bit line outputs BO, BO_N are biased to the predetermined voltage. The bit line outputs BO, BO_N are also capacitively loaded at this time. This is referred to as the tri-state output of the driver 60.

To activate the driver 60, the enable signal EN is set high and the equilibration signal EQ is set low. Current is pulled through the driver 60 depending upon the state of the data inputs DI, DI_N (as described above). Complementary source and sink currents appear on the bit line outputs BO, BO_N. The pulled current changes the predetermined bias voltage by a few hundred millivolts because some of the capacitance on the bit line outputs BO, BO_N becomes discharged. For example, the voltage on the first bit line output BO drops a few hundred millivolts, while the voltage on the second bit line output BO_N goes up a few hundred millivolts so that the lines are now approximately 500 millivolts from each other.

If a selected cell's content is different than the data being applied on the bit lines via the outputs BO, BO_N, the opposing currents on the bit line outputs BO, BO_N will cause the cell to change state to match the state of the bit line outputs BO, BO_N. The change occurs rather quickly because only a small swing on the bit line outputs BO, BO_N occurs.

Thus, using opposing currents on the bit lines (via the bit line outputs BO, BO_N) to charge and discharge the parasitic capacitance on the lines allows the rate and magnitude of the differential voltage change on the bit lines to be tightly controlled. Moreover, restricting the differential voltage change to a safe level above the required minimum, but not much more, reduces the time required to execute the write operation and lowers the power consumption in the process.

Figure 6:
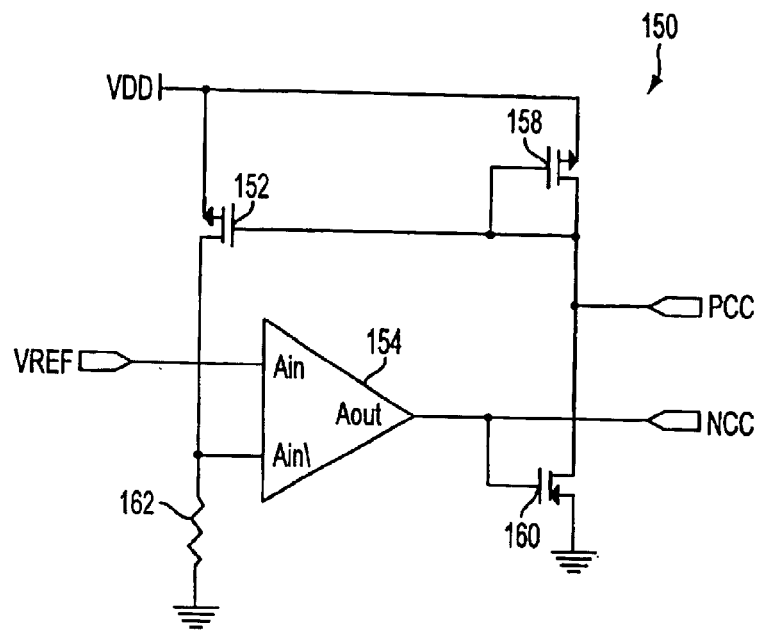
FIG. 6 is a circuit diagram illustrating an exemplary current control loop circuit.

FIG. 6 is a circuit diagram illustrating an exemplary current control loop circuit 150 that can be used to generate the first and second control signals PCC, NCC used by the driver 60 illustrated in FIG. 5. The circuit 150 includes two p-type transistors 152, 158, an n-type transistor 160, an operational amplifier (op amp) 154 and a resistor 162. It should be noted that this is merely one example of how the control signals PCC, NCC can be generated.

The first p-type transistor 152 is connected between a first voltage (e.g., VDD) and an input of the op amp 154. The resistor 162 is connected between a second voltage (e.g., ground) and the input of the op amp 154 that is connected to the first p-type transistor 152. The first p-type transistor 152 has its gate connected to the gate and drain terminal of the second p-type transistor 158. The second p-type transistor 158 has its source terminal connected to the first voltage. The drain terminal of the second p-type transistor 158 is connected to the n-type transistor 160. The n-type transistor 160 has is gate connected to the output of the op amp 154 and is connected to the second voltage.

The second input of the op amp 154 is connected to a voltage reference VREF. The output of the op amp 154 is the second control signal NCC. The first control signal PCC is formed at the intersection of the connections between the n-type transistor 160 and the second p-type transistor 158. The first and second control signal PCC, NCC are controlled by the looping feedback into the op amp 154 and the drop between the second p-type transistor 158 and the n-type transistor 160. The current of the driver 60 is essentially the voltage reference VREF divided by the resistance of the resistor 162 multiplied by a gain factor determined by the current loop and the op amp 154.

The driver 60 illustrated in FIG. 5 biases the bit lines (via bit line outputs BO, BO_N) to the predetermined voltage (somewhere between VDD and VDD/2). When a read out from a selected cell is required, the cell is connected to the biased bit lines. The cell has two complementary outputs. Whenever one of these outputs is high, the other must be low. When the cell is connected to the bit lines, the side of the cell which is low pulls the current from its respective bit line to discharge it to a low voltage. The other side of the cell draws no current. A special amplifier is used to sense the current difference and convert it to a logic 1 or 0 voltage level.

Figure 7:
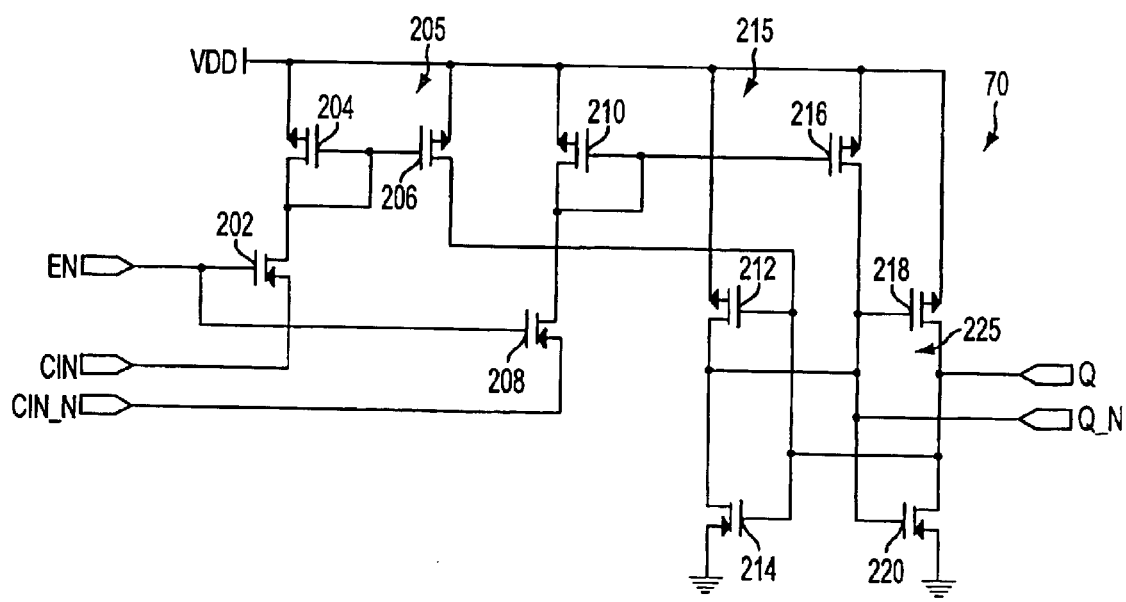
FIG. 7 is a circuit diagram illustrating a differential current sensing read amplifier constructed in accordance with an embodiment of the invention.

FIG. 7 is a circuit diagram illustrating a differential current sensing read amplifier 70 constructed in accordance with an embodiment of the invention. The amplifier 70 includes a four n-type transistors 202, 208, 214, 220 and six p-type transistors 204, 206, 210, 212, 216, 218. The first n-type transistor 202 is coupled between a first memory cell input CIN and a current mirror circuit 205 comprised of the first and second p-type transistors 204, 206. The second n-type transistor 208 is coupled between a second memory cell input CIN_N (which is typically the complement of the first memory cell input CIN) and a second current mirror circuit 215 comprised of the third and fourth p-type transistors 210, 216. The gates of the first and second n-type transistors 202, 208 are connected to an enable signal EN.

The fifth p-type transistor 212 is connected between a first voltage (e.g., VDD) and the third n-type transistor 214. The third n-type transistor is also connected to a second voltage (e.g., ground). The sixth p-type transistor 218 is connected between the first voltage and the fourth n-type transistor 220. The fourth n-type transistor is also connected to the second voltage. The gate of the fifth p-type transistor 212 is connected to the gate of the third n-type transistor 214, which is also coupled to the connection between the sixth p-type transistor 218 and the fourth n-type transistor 220. The gate of the sixth p-type transistor 218 is connected to the gate of the fourth n-type transistor 220, which is also coupled to the connection between the fifth p-type transistor 212 and the third n-type transistor 214. This cross-coupling of the transistors 212, 214, 218, 220 forms a flip-flip circuit 225. The outputs of the flip-flop 225 and thus, the amplifier 70, are first and second sense data outputs Q, Q_N.

In operation, when the enable signal EN is high (e.g., VDD), the first n-type and p-type transistors 202, 208 pull in or sense the current from the memory cell inputs CIN, CIN_N. Typically, reading from a cell pulls one of the bit lines high and the other low. Thus, there will be a difference in the current that flows through the first n-type and p-type transistors 202, 208. The current mirrors 205, 215 mirror this current flowing through the first n-type and p-type transistors 202, 208, respectively. This charges the capacitance, and thus the voltage, on the input of the fourth p-type and third n-type transistors 212, 214 or the capacitance, and the voltage, on the input of the sixth p-type and fourth n-type transistors 218, 220. States of the flip-flip circuit 225 change by charging the capacitance. Since one current is larger than the other, the voltage goes up faster than the other and because of the flip-flip circuit 225, one side goes up and the other side goes down. Thus, a stable state for the first and second sense data outputs Q, Q_N is achieved.

Figure 8:
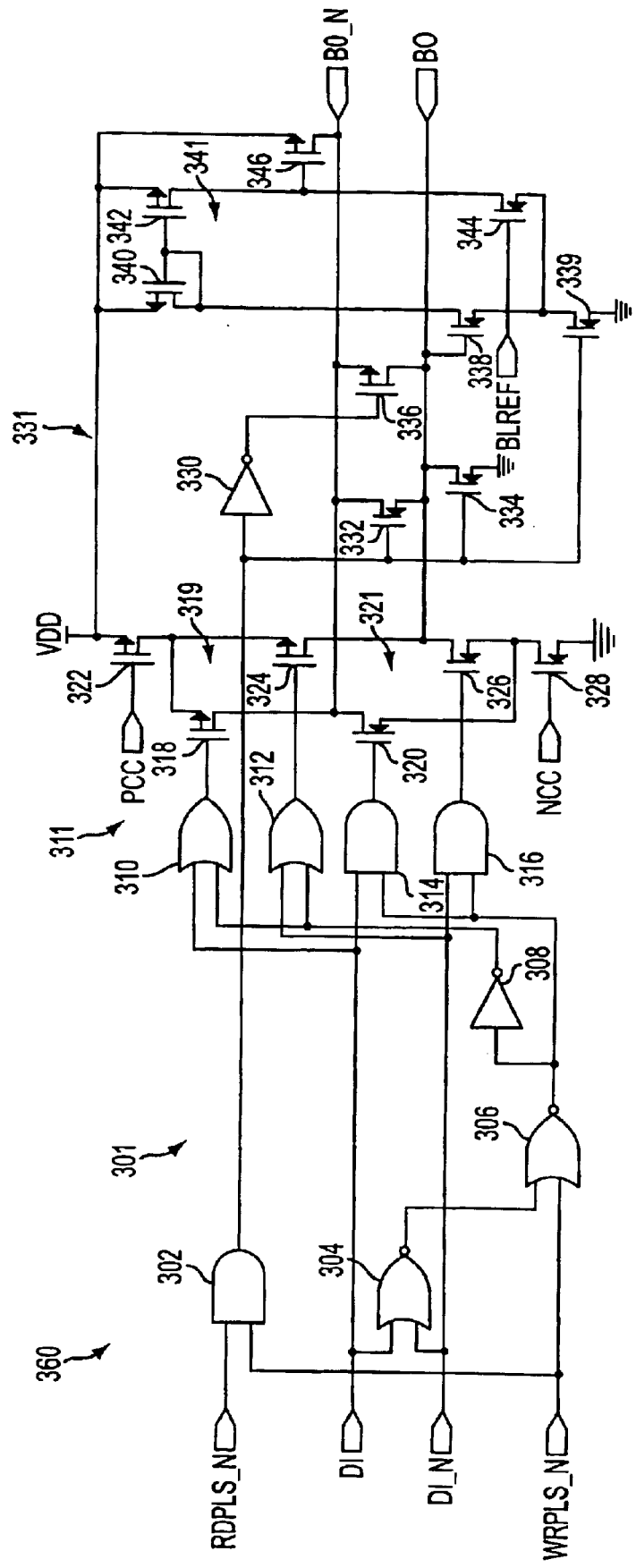
FIG. 8 is a circuit diagram illustrating another differential bit line driver constructed in accordance with another embodiment of the invention.

FIG. 8 is a circuit diagram illustrating another differential bit line driver 360 constructed in accordance with another embodiment of the invention. The another differential bit line driver 360 includes an input logic circuit 301, a driver circuit 311 and a biasing circuit 331.

The input logic circuit 301 includes an AND gate 302, two NOR gates 304, 306 and an inverter 308. The AND gate 302 has a first input connected to receive a read pulse RDPLS_N and a second input connected to receive a write pulse WRPLS_N. The read pulse RDPLS_N is at a low level when a read operation is in progress. The write pulse WRPLS_N is at a low level when a write operation is in progress. The first NOR gate 304 inputs the first data input DI and the second data input DI_N. Since the driver 360 is a write driver, the data inputs DI, DI_N represent a write data input bit and are typically complements of each other when write data is being input. In certain circumstances, such as when a write operation is completed, or when writing is not desirable during a write process, it is desirable to have both DI and DI_N set to a low level.

The output of the NOR gate 304 is used as an input to the second NOR gate 306. The second NOR gate 306 also inputs the write pulse WRPLS_N. The output of the second NOR gate 306 is used as an input to the inverter 308 and as an input to the driver circuit 311. The two data inputs DI, DI_N are also used as inputs by the driver circuit 311. The output of the AND gate 302 is used as an input to the biasing circuit 331.

The driver circuit 311 includes two OR gates 310, 312, second and third AND gates 314, 316, three p-type transistors 318, 322, 324 and three n-type transistors 320, 326, 328. The first OR gate 310 inputs the first data input DI and the output of the first inverter 308. The second OR gate 312 inputs the second data input DI_N and the output of the first inverter 308. The second AND gate 314 inputs the output of the second NOR gate 306 and the first data input DI. The third AND gate 316 inputs the output of the second NOR gate 306 and the second data input DI_N.

The first p-type transistor 322 is connected between a first voltage (e.g., VDD) and a connection between the second and third p-type transistors 318, 324. The first p-type transistor 322 has its gate connected to the first control signal PCC. The first control signal PCC is used to control the resistance of the first p-type transistor 322, making the transistor 322 essentially a variable resistor. The output of the first OR gate 310 is connected to the gate of the second p-type transistor 318, which is connected between the first n-type transistor 320 and the connection between the first and third p-type transistors 322, 324. The third p-type transistor 324 is connected between the first p-type transistor 322 and the second n-type transistor 326. The output of the second OR gate 312 is connected to the gate of the third p-type transistor 324. As will become apparent, the second and third p-type transistors 318, 324 form a differential current switch 319.

The first n-type transistor 320 has its gate connected to the output of the second AND gate 314 and is also connected to the connection between the second and third n-type transistors 326, 328. The second n-type transistor 326 has its gate connected to the output of the third AND gate 316 and is also connected between the third n-type and p-type transistors 326, 324. The first and second n-type transistors 320, 326 form a differential current switch 321. The third n-type transistor 328 is also connected between a second voltage (e.g., ground) and the connection of the first and second n-type transistors 320, 326. The third n-type transistor 328 has its gate connected to the second control signal NCC, which controls the resistance of the third n-type transistor 328 essentially making it a variable resistor.

First and second bit line outputs BO, BO_N are output from the driver circuit 311, which are connected to first and second bit lines, respectively. The first and second bit line outputs BO, BO_N are also connected to the biasing circuit 331. The biasing circuit 331 includes a second inverter 330, five n-type transistors 332, 334, 338, 339 344 and four p-type transistors 336, 340, 342, 346. The fourth n-type and p-type transistors 332, 336 are each connected between the first and second bit line outputs BO, BO_N. The fourth n-type transistor has its gate connected to the output of the first AND gate 302. The fourth p-type transistor 336 has its gate connected to the output of the second inverter 330.

The output of the first AND gate 302 is also connected to the gate terminals of the fifth and seventh n-type transistors 334, 339. The fifth n-type transistor 334 is connected between the first bit line output BO and the second voltage (e.g., ground). The fifth p-type transistor 340 is coupled between the sixth n-type transistor 338 and the first voltage. The fifth p-type transistor 340 has its gate connected to the gate of the sixth p-type 342 and its own drain terminal. The sixth p-type transistor 342 is coupled between the first voltage and the eighth n-type transistor 344. The seventh p-type transistor 346 is coupled between the first voltage and the second bit line output BO_N and has its gate connected to the connection between the sixth p-type transistor 342 and the eighth n-type transistor 344.

The sixth n-type transistor 338 has its gate terminal connected to the first bit line output BO and is connected between the fifth p-type transistor 340 and the seventh n-type transistor 339. The seventh n-type transistor 339 is connected between the second voltage 339 and the sixth n-type transistor 338. The eighth n-type transistor 344 has its gate connected to the bit line reference BLREF. The fifth and sixth p-type transistors 340, 342 and the sixth and eighth n-type transistors 338, 344 form a differential amplifier 341. The first bit line output BO and the bit line reference BLREF are the inputs to the differential amplifier 341.

The driver 360 of this embodiment operates essentially the same as the driver 60 illustrated in FIG. 5. However, this driver 360 is an improvement over the driver 60 illustrated in FIG. 5 for the following reasons. In the driver 60 (FIG. 5), when both data inputs DI, DI_N were low at the same time, there is a guarantee that there would be no current on the bit line outputs BO, BO_N. In the present embodiment, current can be blocked during the tri-state case because of the input logic circuit 301. Specifically, when DI, DI_N are low, the output of the first NOR gate 304 goes high causing the output of the second NOR gate 306 to go low (meaning no read or write pulse RDPLS_N, WRPLS_N), the outputs of the second and third AND gates 314, 316 go low and the outputs of the first and second OR gates 310, 312 go high. This causes all of the transistors 318, 324, 320, 326 in the two differential switches 319, 321 to turn off, which blocks the current flow.

In addition, it is desirable for the driver 311 to have the tri-state condition all of the time except when a write operation is occurring (i.e., when the write pulse WRPLS_N is set to a low level). It is also desirable to bias the bit lines all of the time except when there is a read or write operation (i.e., when one of the read or write pulses RDPLS_N, WRPLS_N is set to a low level). This is accomplished by tying the bit line outputs BO, BO_N to a known reference BLREF that can be set and controlled as desired (see FIG. 10).

For example, the two bit line outputs BO, BO_N may be shorted by either the fourth n-type or p-type transistors 332, 336 depending upon the output of first AND gate 302 and second inverter 330. When the fifth n-type transistor 334 is activated, it pulls down the first bit line output BO. The differential amplifier 341, which inputs the first bit line output BO and the bit line reference BLREF operates as follows. If the first bit line output BO is lower than the bit line reference BLREF, then current flows through the sixth and seventh n-type transistors 338, 339 to ground, which causes the voltage on the gate of the seventh p-type transistor 346 to be lower, rendering the transistor 346 to be more active. This pulls the second bit line output BO_N up.

If the output of the first AND gate 302 goes low (i.e., when one of the read or write pulses RDPLS_N, WRPLS_N is set to a low level), the biasing circuit 331 must be disconnected. This occurs by turning off the fourth n-type and p-type transistors 332, 336, and the fifth and seventh n-type transistors 334, 339. Thus, the driver 360 exhibits better bias control and allows for the selection of biasing to occur based on the read or write pulses RDPLS_N, WRPLS_N.

Figure 9:
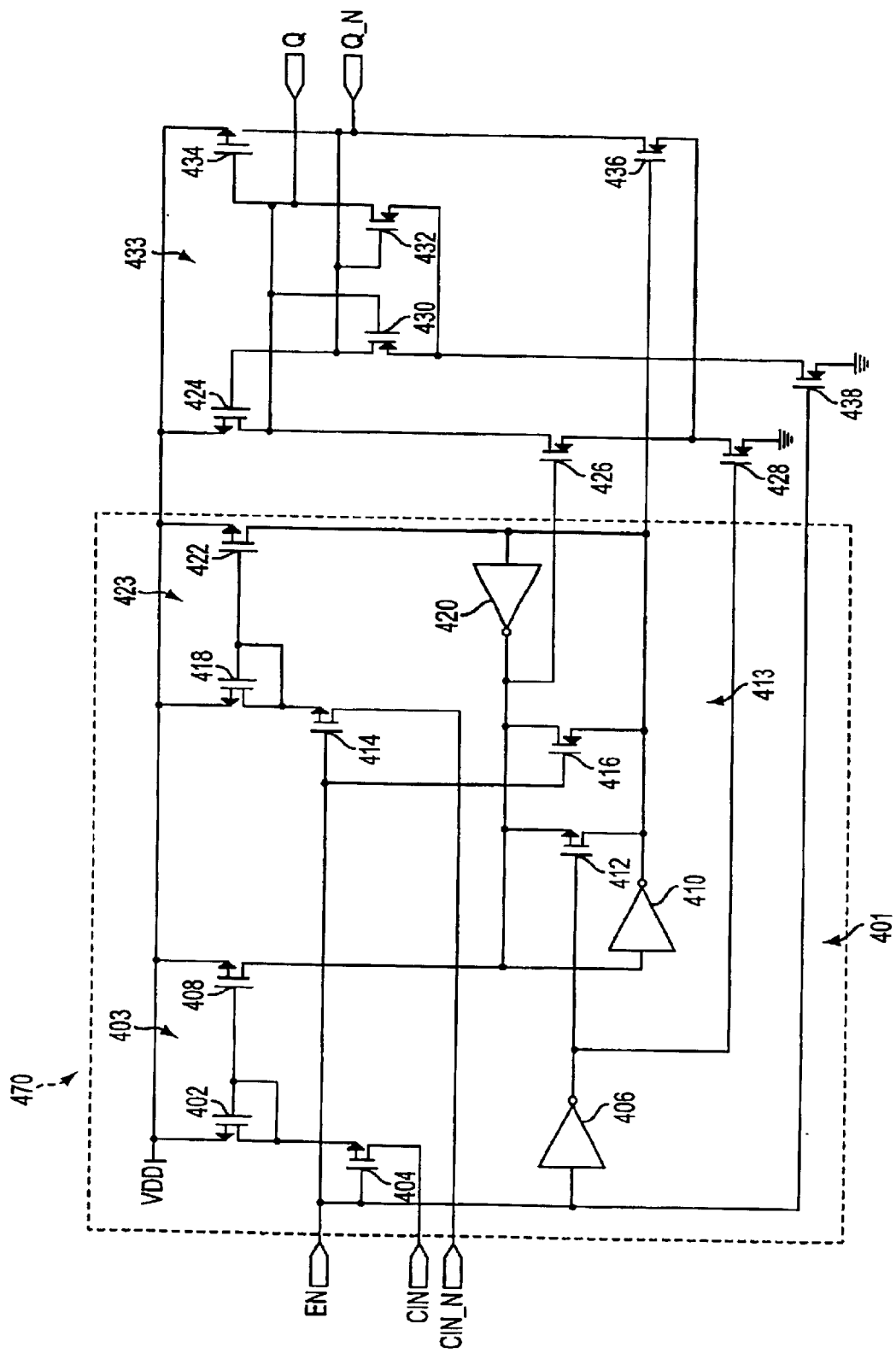
FIG. 9 is a circuit diagram illustrating another differential current sensing read amplifier constructed in accordance with another embodiment of the invention.

FIG. 9 is a circuit diagram illustrating another differential current sensing read amplifier 470 constructed in accordance with another embodiment of the invention. The amplifier 470 includes a first latch circuit 401 comprised of three inverters 406, 410, 420, an n-type transistor 416 and seven p-type transistors 402, 404, 408, 412, 414, 418, 422. The amplifier 470 also includes a second latch circuit 433 comprised of two n-type transistors 430, 432 and two p-type transistors 424, 434. Additional n-type transistors 426, 428, 436, 438 are also included within the amplifier 470.

The first p-type transistor 402 has its gate connected to its drain and the gate of the third p-type transistor 408. The first p-type transistor 402 is coupled between the first voltage (e.g., VDD) and the second p-type transistor 404. The third p-type transistor 408 is connected between the first voltage and the input to the second inverter 410. The second p-type transistor 404 is connected between the first p-type transistor 402 and a first cell input CIN. The gate of the second p-type transistor 404 is connected to an enable signal EN. The second p-type transistor 404 serves as a sensing transistor for sensing the current of the first cell input CIN. The configuration of the first and third p-type transistors 402, 408 forms a first current mirror circuit 403 that mirrors any current flowing through the second p-type transistor 404.

The enable signal EN is also used as an input to the first inverter 406. The output of the first inverter 406 is connected to the gate of the fourth p-type transistor 412, which is connected between the input and output of the second inverter 410. A fifth p-type transistor 414 has its gate connected to the enable EN and is connected between a second cell input CIN_N and the sixth p-type transistor 418. The sixth p-type transistor 418 is also connected to the first voltage 418 and has its gate connected to the seventh p-type transistor 422. The seventh p-type transistor 422 is connected between the first voltage and the input to the third inverter 420. The fifth p-type transistor 414 serves as a sensing transistor for sensing the current of the second cell input CIN_N. The configuration of the sixth and seventh p-type transistors 418, 422 forms a second current mirror circuit 423 that mirrors any current flowing through the fifth p-type transistor 414.

The first n-type transistor 416 has its gate connected to the enable signal EN and is connected between the outputs of the second and third inverters 416, 420. The second and third inverters 410, 420, the fourth p-type transistor 412 and the first n-type transistor 416 form a flip-flop circuit 413. Outputs of the flip-flop circuit 413 are connected to the gates of the second, third and sixth n-type transistors 426, 428, 436. The third n-type transistor 438 is connected between the second voltage (e.g., ground) and the second n-type transistor 426. The second n-type transistor 426 is connected between the eighth p-type transistor 424 and the third n-type transistor 426. The sixth n-type transistor 436 is connected between an output Q_N of the second latch 433 and the connection between the second and third n-type transistors 426, 428.

The eighth and ninth p-type transistors 424, 434 and the fourth and fifth n-type transistors 430, 432 are connected in a cross-coupled manner forming the second latch circuit 433. The outputs of the second latch 433 and thus, the amplifier 470, are first and second sense data outputs Q, Q_N.

In operation, when the enable signal EN is high, the second and fifth p-type transistors 404, 414 are off and the fourth p-type and first n-type transistors 412, 416 within the flip-flop circuit 413 are turned on. This shorts the two inverters 410, 420 to get the same potential on both outputs of the flip-flop 413 (i.e., the outputs connected to the second and sixth n-type transistors 426, 436). When the enable signal EN is low, the second and fifth p-type transistors 404, 414 are on and the fourth p-type and first n-type transistors 412, 416 within the flip-flop circuit 413 are turned off. The current difference can be small for a change in the state of the flip-flop 413.

Also, when the enable signal EN is low, and the output of the first inverter 406 is high, the third n-type transistor 428 is activated, and either the second or sixth n-type transistors 426, 436 are on. Current will flow through either the second or sixth n-type transistor 426, 436. If, for example, the second n-type transistor 426 is on, there will be a voltage on the eight p-type transistors 424, which causes the first output Q to go low.

If the enable signal EN goes high, the third n-type transistor 438 turns off, the seventh n-type transistor 438 turns on, which activates the fourth and fifth n-type transistors 430, 432 such that the latch 433 maintains its state. Thus, the output of the latch 433 follows the changes of the input data when enabled (via EN) and maintains its last state when not enabled. Thus, the amplifier 470 of the current embodiment allows for quick changes of the flip-flop circuit 413 responsible for converting the sensed current into the correct logic 1 or 0 voltage level. The amplifier 470 is also keeps its data stable between read operations.

Figure 10:
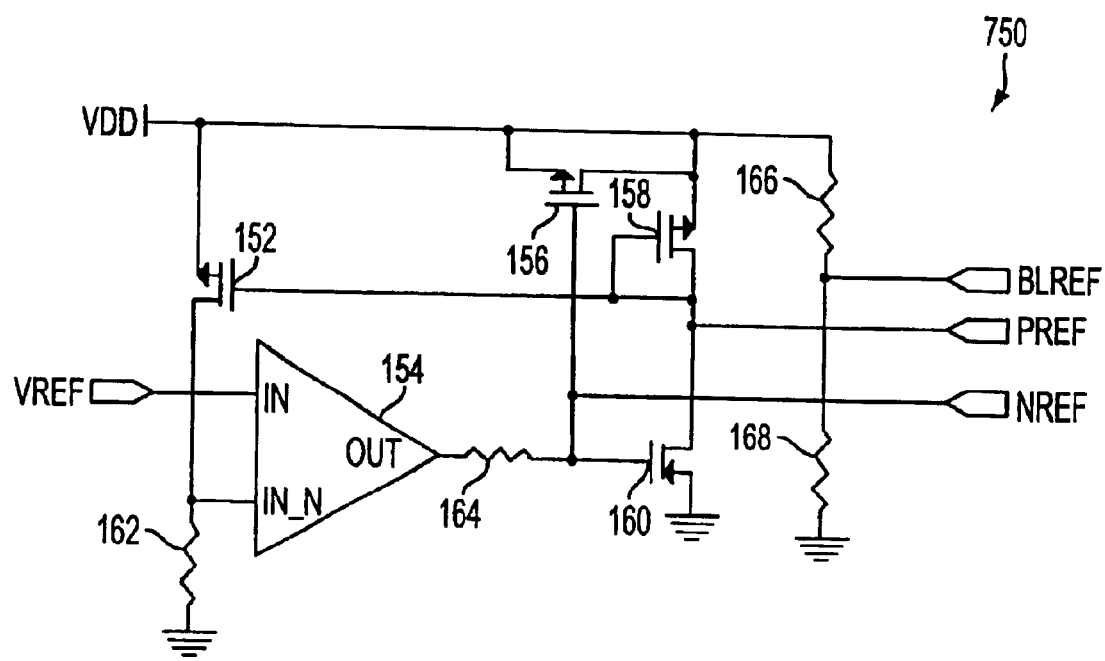
FIG. 10 is a circuit diagram illustrating another exemplary current control loop circuit.

FIG. 10 is a circuit diagram illustrating an exemplary current control loop circuit 750 that may be used to generate the control signals PREF, NREF and the bit line reference BLREF by the driver 360. The circuit 750 is similar to the circuit 150 illustrated in FIG. 6 with the exception that additional resistors 166, 168 are provided between the first and second voltages. The resistors 166, 168 form a voltage divider that generates the bit line reference BREF. A third p-type resistor 156 is also added to stabilize the generation of the control signals PREF, NREF (which is substantially the same as the generation of the PCC and NCC signals illustrated in FIG. 5).

Figure 11:
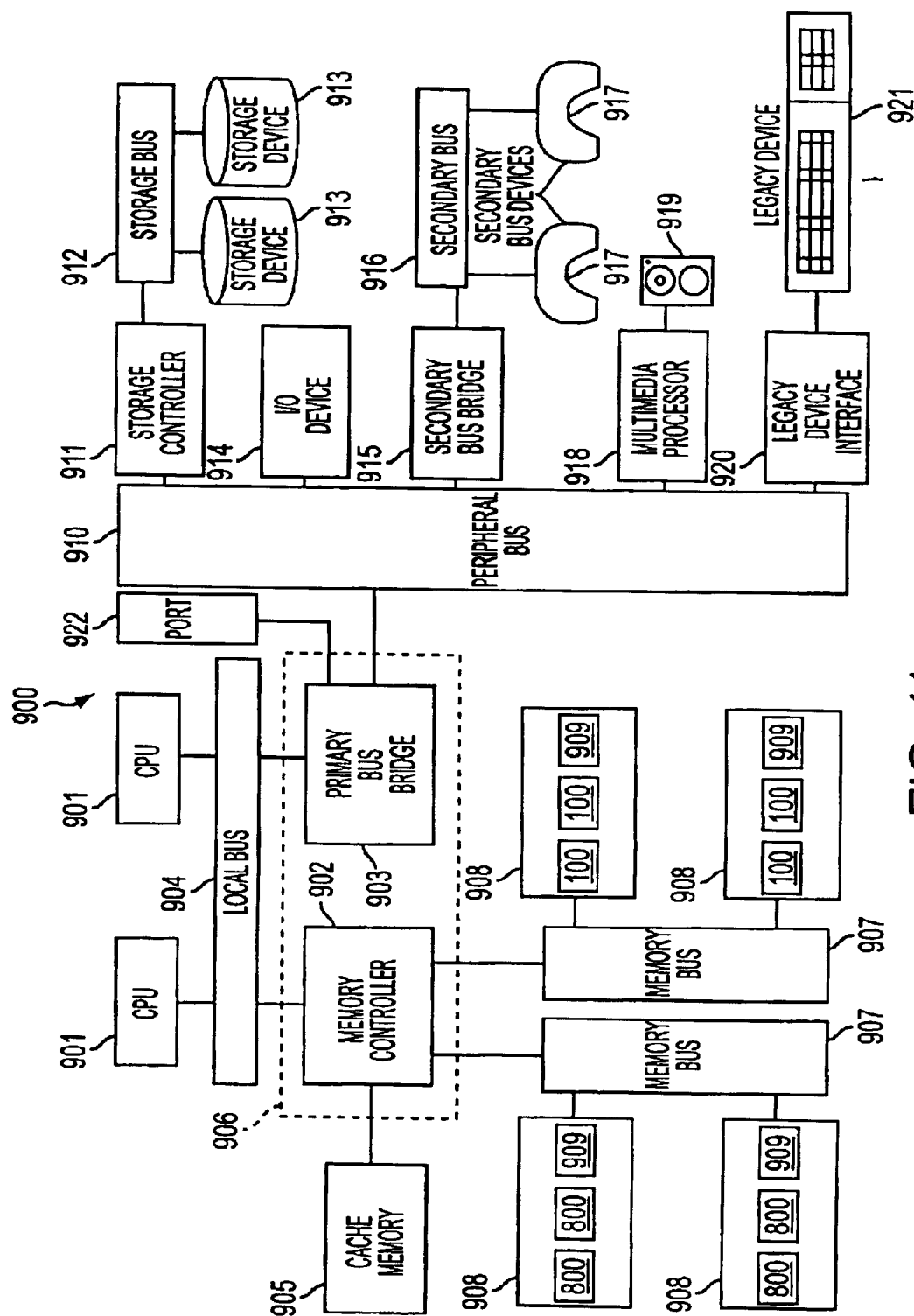
FIG. 11 is a block diagram illustrating a processor system utilizing an SRAM or CAM constructed in accordance with an embodiment of the invention.

FIG. 11 illustrates an exemplary processing system 900 which may utilize a memory device 800 constructed in accordance with an embodiment of the present invention. That is, the memory device 800 may be an SRAM or CAM device that utilizes one of the differential current drivers 60, 360 illustrated in FIGS. 5 and 8 and one of the differential current sensing amplifiers 70, 470 illustrated in FIGS. 7 and 9.

The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 800 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 11 is only an exemplary processing system with which the invention may be used. While FIG. 11 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 800. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Figure 12:
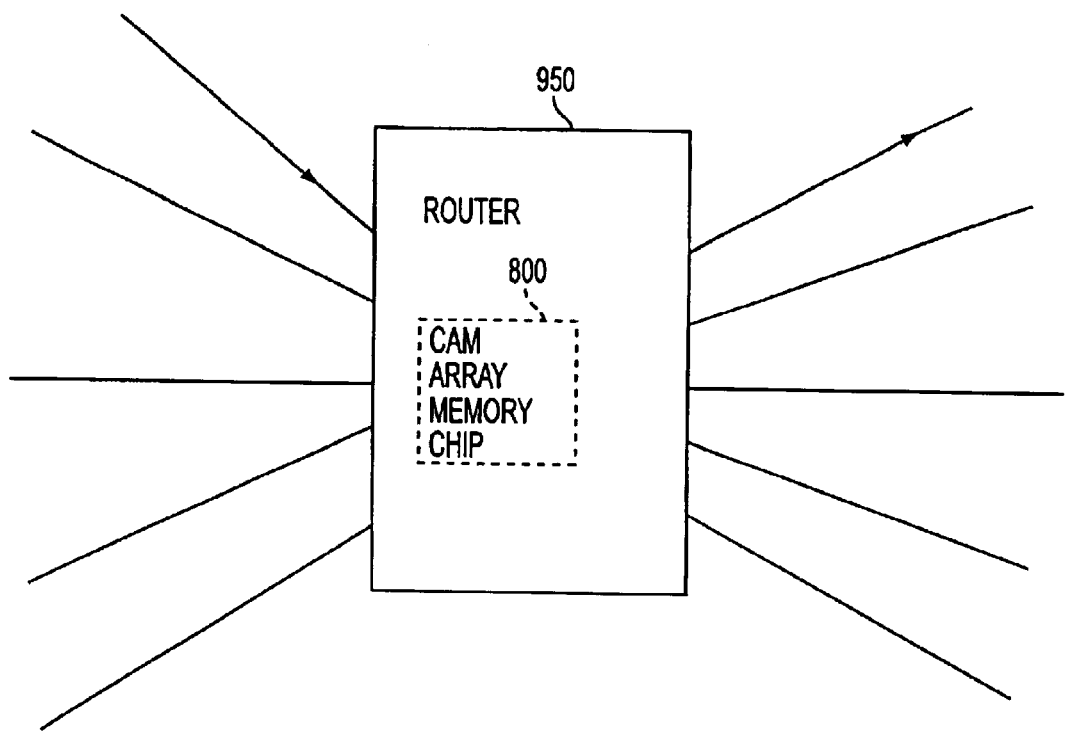
FIG. 12 is a block diagram illustrating a network router utilizing a CAM constructed in accordance with an embodiment of the invention.

FIG. 12 is a simplified block diagram of a router 950 as may be used in a communications network, such as, e.g., part of the Internet backbone. The router 950 contains a plurality of input lines and a plurality of output lines. When data is transmitted from one location to another, it is sent in a form known as a packet. Oftentimes, prior to the packet reaching its final destination, that packet is first received by a router, or some other device. The router 950 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 950, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 12, router 950 contains the added benefit of employing a semiconductor memory chip containing a CAM device 800, such as the CAM devices constructed in accordance with FIGS. 4–10. Therefore, not only does the router benefit from having a CAM but also benefits by having a CAM with reduced power consumption and increased read and write operation speeds.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A static memory device, comprising:
   a static memory cell connected to first and second bit lines;
   an input circuit, said input circuit having first and second inputs for inputting data to be written into a memory cell; and
   a current generating circuit for generating first and second currents in response to received input data and applying the first and second currents to the memory cell through the bit lines, said first and second currents representing a value of the input data.

2. The static memory device of claim 1, further comprising a biasing circuit coupled to said bit lines, said biasing circuit biasing the bit lines to a predetermined voltage level when a write operation is not being performed.

3. The static memory device of claim 1, further comprising a biasing circuit coupled to said bit lines, said biasing circuit biasing the bit lines to a predetermined voltage level when a read operation or a write operation is not being performed.

4. The static memory device of claim 3, wherein the predetermined voltage is smaller than a first voltage used to power the driver, but more than half of the first voltage.

5. The static memory device of claim 1, wherein said current generating circuit comprises:
   a first adjustable resistive element connected to a first voltage, a resistance of said first adjustable resistive element being controllable by a first control signal;
   a second adjustable resistive element connected to a second voltage, a resistance of said second adjustable resistive element being controllable by a second control signal;
   a first switch for switching in the resistance of the first adjustable resistive element in response to a third control signal; and
   a second switch for switching in the resistance of the second adjustable resistive element in response to a fourth control signal,
   wherein said first voltage is applied to said first adjustable resistive element and said second voltage is applied to said second adjustable resistive element when said third and fourth control signals are received.

6. The static memory device of claim 5, further comprising a current loop generating circuit for generating the first and second control signals based on a reference voltage and a resistance of said current loop generating circuit.

7. The static memory device of claim 1, further comprising:
   a biasing circuit comprising:
   a first resistive element coupled between a first voltage and the first bit line;
   a second resistive element coupled between a second voltage and the second bit line; and
   a third resistive element coupled between the first and second bit lines, wherein said resistive elements are controlled to produce a predetermined voltage level on said bit lines when a write operation is not being performed.

8. The static memory device of claim 1, wherein the static memory cell is a static random access memory cell.

9. The static memory device of claim 1, wherein the static memory cell is a content addressable memory cell.

10. A static memory device comprising:
    a static memory cell connected to first and second bit lines;
    means for sensing first and second currents respectively from said first and second bit lines;
    means for converting the sensed first and second currents into a voltage level representing a logical value of a content of the cell; and
    means for latching the logical value until the next read operation is performed on the cell.

11. The static memory device of claim 10, wherein said means for sensing comprises:
    means for biasing the bit lines to a predetermined voltage;
    means for discharging one of the bit lines based on the content of the memory cell; and means for sensing the current on the bit lines.

12. The static memory device of claim 10, wherein said means for sensing comprises:

means for biasing the bit lines to a predetermined voltage;

means for charging one of the bit lines based on the content of the memory cell; and means for sensing the current on the bit lines.

13. A processor system comprising:

a processor; and a memory circuit connected to said processor, said memory circuit comprising:

a static memory cell connected to first and second bit lines, an input circuit, said input circuit having first and second inputs for inputting data to be written into a memory cell, and a current generating circuit for generating first and second currents in response to received input data and applying the first and second currents to the memory cell through the bit lines, said first and second currents representing a value of the input data.

14. The system of claim 13, wherein said memory circuit further comprises a biasing circuit coupled to said bit lines, said biasing circuit biasing the bit lines to a predetermined voltage level when a write operation is not being performed.

15. The system of claim 13, wherein said memory circuit further comprises a biasing circuit coupled to said bit lines, said biasing circuit biasing the bit lines to a predetermined voltage level when a read operation or a write operation is not being performed.

16. The system of claim 15, wherein the predetermined voltage is smaller than a first voltage used to power the driver, but more than half of the first voltage.

17. The system of claim 13, wherein said current generating circuit comprises:

a first adjustable resistive element connected to a first voltage, a resistance of said first adjustable resistive element being controllable by a first control signal;

a second adjustable resistive element connected to a second voltage, a resistance of said second adjustable resistive element being controllable by a second control signal;

a first switch for switching in the resistance of the first adjustable resistive element in response to a third control signal; and a second switch for switching in the resistance of the second adjustable resistive element in response to a fourth control signal, wherein said first voltage is applied to said first adjustable resistive element and said second voltage is applied to said second adjustable resistive element when said third and fourth control signals are received.

18. The system of claim 17, wherein said memory circuit further comprises a current loop generating circuit for generating the first and second control signals based on a reference voltage and a resistance of said current loop generating circuit.

19. A processor system comprising:

a processor; and a memory circuit connected to said processor, said memory circuit comprising:

a static memory cell connected to first and second bit lines, means for sensing first and second currents respectively from said first and second bit lines, means for converting the sensed first and second currents into a voltage level representing a logical value of a content of the cell, and means for latching the logical value until the next read operation is performed on the cell.

20. The system of claim 19, wherein said means for sensing comprises:

means for biasing the bit lines to a predetermined voltage;

means for discharging one of the bit lines based on the content of the memory cell; and means for sensing the current on the bit lines.

21. The system of claim 19, wherein said means for sensing comprises:

means for biasing the bit lines to a predetermined voltage;

means for charging one of the bit lines based on the content of the memory cell; and means for sensing the current on the bit lines.

* * * * *